US006466008B1

United States Patent
Fung et al.

(10) Patent No.: US 6,466,008 B1
(45) Date of Patent: Oct. 15, 2002

(54) METHOD FOR MATCHING THE LENGTHS OF SIGNAL TRACES

(75) Inventors: Patrick Ying-Cheung Fung, Sacramento; Carl Lewis Wuebker, Citrus Heights, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 46 days.

(21) Appl. No.: 09/680,577

(22) Filed: Oct. 6, 2000

(51) Int. Cl.⁷ .............................................. G06F 17/50
(52) U.S. Cl. ...................... 324/158.1; 716/13
(58) Field of Search ............................... 324/765, 158.1, 324/766; 361/803, 777; 257/664, 738; 716/4, 5, 6, 10, 13

(56) References Cited

U.S. PATENT DOCUMENTS 5,640,048 A * 6/1997 Selna .......................... 257/738
5,777,529 A * 7/1998 Lowe .......................... 257/664
5,872,459 A * 2/1999 Pasiecznik, Jr. ............. 324/765
6,072,699 A * 6/2000 Horine ......................... 361/777
6,246,252 B1 * 6/2001 Malladi et al. .............. 324/765

* cited by examiner

Primary Examiner—Michael Sherry
Assistant Examiner—Russell M. Kobert

(57) ABSTRACT

Method for obtaining a difference in lengths among a plurality of signal traces formed on two different surfaces, includes dividing a propagation delay of a first surface into a propagation delay of a second surface to obtain a correction factor. The segment of the signal traces formed on the second surface is adjusted by multiplying the correction factor to this segment. Then, the adjusted segment is summed with the segment of the signal traces formed on the first surface to obtain a total length. The total length of each of the signal traces is subtracted from the longest total length of the signal traces.

17 Claims, 4 Drawing Sheets

Fig. 3A

| SEGMENT NAME | CFA1 | CFB1 |
|---|---|---|
| ENTER PCB TRACE LENGTH | 80 | 100 |
| PACKAGE PIN NUMBER | | |
| PACKAGE TRACE LENGTH | | |
| TOTAL TRACE LENGTH | 80 | 100 |
| TARGET TRACE LENGTH (LONGEST) | 100 | 100 |
| WITHIN TOLERANCE OF 10 mils | <<NO>> | YES |
| ADD TRACE LENGTH FOR EXACT MATCH | 20 | 0 |

Fig. 3B

| SEGMENT NAME | CFA2+ CFA3 | CFB2+ CFB3 |
|---|---|---|
| ENTER PCB TRACE LENGTH | 150 | 150 |
| PACKAGE PIN NUMBER | 26 | 28 |
| PACKAGE TRACE LENGTH | 75 | 80 |
| TOTAL TRACE LENGTH | 235 | 235 |
| TARGET TRACE LENGTH (LONGEST) | 235 | 235 |
| WITHIN TOLERANCE OF 20 mils | YES | YES |
| ADD TRACE LENGTH FOR EXACT MATCH | 10 | 0 |

Fig. 4

| SEGMENT NAME | AN+A1+AC | BN+B1+BC | A2+BF | B2+BF |
|---|---|---|---|---|
| TRACE LENGTH FROM PACKAGE | 1500 | 1550 | 1670 | 1500 |
| PACKAGE PIN NUMBER | 68 | 70 | 72 | 74 |
| CONNECTOR | AC | BC | | |
| PACKAGE TRACE LENGTH | 423 | 522 | 467 | 522 |
| CONNECTOR ADJUSTMENT | | 100 | | |
| TOTAL LENGHT | 1923 | 2172 | 2137 | 2022 |
| TARGET TRACE LENGHT | 2172 | 2172 | 2137 | 2137 |
| WITHIN TOLERANCE? | NO | YES | YES | NO |
| LENGTH FOR EXACT MATCH | 249 | 0 | 0 | 115 |

US 6,466,008 B1

METHOD FOR MATCHING THE LENGTHS OF SIGNAL TRACES

The present invention generally relates to signal trace routing designs, and more particularly to a method for matching the lengths of signal traces in view of signal propagation delays in a circuit board layout environment.

Software programs for routing or laying out signal traces on circuit boards, such a printed circuit board (PCB) and a backplane or motherboard are well known in the art. Computer aided design (CAD) software is one such program. These programs, however, do not have the capability for accurately matching the lengths of signal traces when there are signal propagation delays. These delays are typically caused by interface connectors on the PCB and the different material used for the substrates on which the signal traces are formed, for example.

Presently, even when the lengths of the traces are matched, each time an adjustment is made to one trace length, the lengths of the other trace or traces being matched must also be adjusted, thereby requiring multiple iterations of manual adjustments. Also, information regarding propagation delays cannot be back annotated to the existing software programs, which makes matching the trace lengths difficult.

Accordingly, it is a primary objective of the present invention to provide an improved method for matching the trace lengths of at least two signal traces on a circuit board.

Another object of the present invention is to provide an improved method for matching signal traces that are connected between at least two circuit boards.

Still another object of the present invention is to provide such an improved method for matching signal trace lengths, which does not require multiple iterations of adjustments.

Yet another object of the present invention is to provide such an improved method for matching the trace lengths, which can be imported into a known software program.

An additional object of the present invention is to provide such an improved method for matching signal trace lengths in which the traces are divided into segments.

More particular object of the present invention is to provide such an improved method for matching the signal traces in which the longest trace length is calculated and the lengths of the shorter signal traces are adjusted by the difference between the longest trace and the shorter traces.

Other objects and advantages will become apparent upon reading the following detailed description, in conjunction with the attached drawings, in which:

FIGS. 3A and 3B are spreadsheets in which the present invention for matching signal traces on a PCB are implemented; and, FIG. 4 is a spreadsheet in which the present invention for matching signal traces that extend from a PCB to a backplane is implemented.

DETAILED DESCRIPTION

The present invention is directed to a method for matching the lengths of signal traces within a predetermined tolerance by matching the propagation delays of the signal traces. The delays of signals propagated on the traces may vary depending on the surface on which the traces are formed. In the present invention, propagation delays arising from various surfaces are normalized to the delay caused by a reference surface, for example, a printed circuit board, to obtain a correction factor. The correction factor is then multiplied to the signal traces formed on the corresponding surface to derive the adjusted length. The total length of each trace are compared with the trace having the longest length to determine the length which must be added to the shorter traces to obtain a match within the allowable tolerance.

Broadly stated, the present invention is directed to a method for matching the lengths a plurality of signal traces which are electrically connected to at least one integrated circuit chip, and includes a board trace which is formed on a circuit board and electrically connected to a corresponding package trace formed on the integrated circuit chip. The method includes multiplying a length of each of the package traces by a correction factor for the corresponding integrated circuit chip on which the package trace is formed. The length of each of the board traces and the multiplied length of each of the corresponding package traces are then summed, and each of the signal traces are subtracted from the length of the longest signal trace from among the added signal traces. The difference in length obtained from the subtraction is added to the shorter signal trace for a match.

Figure 1:
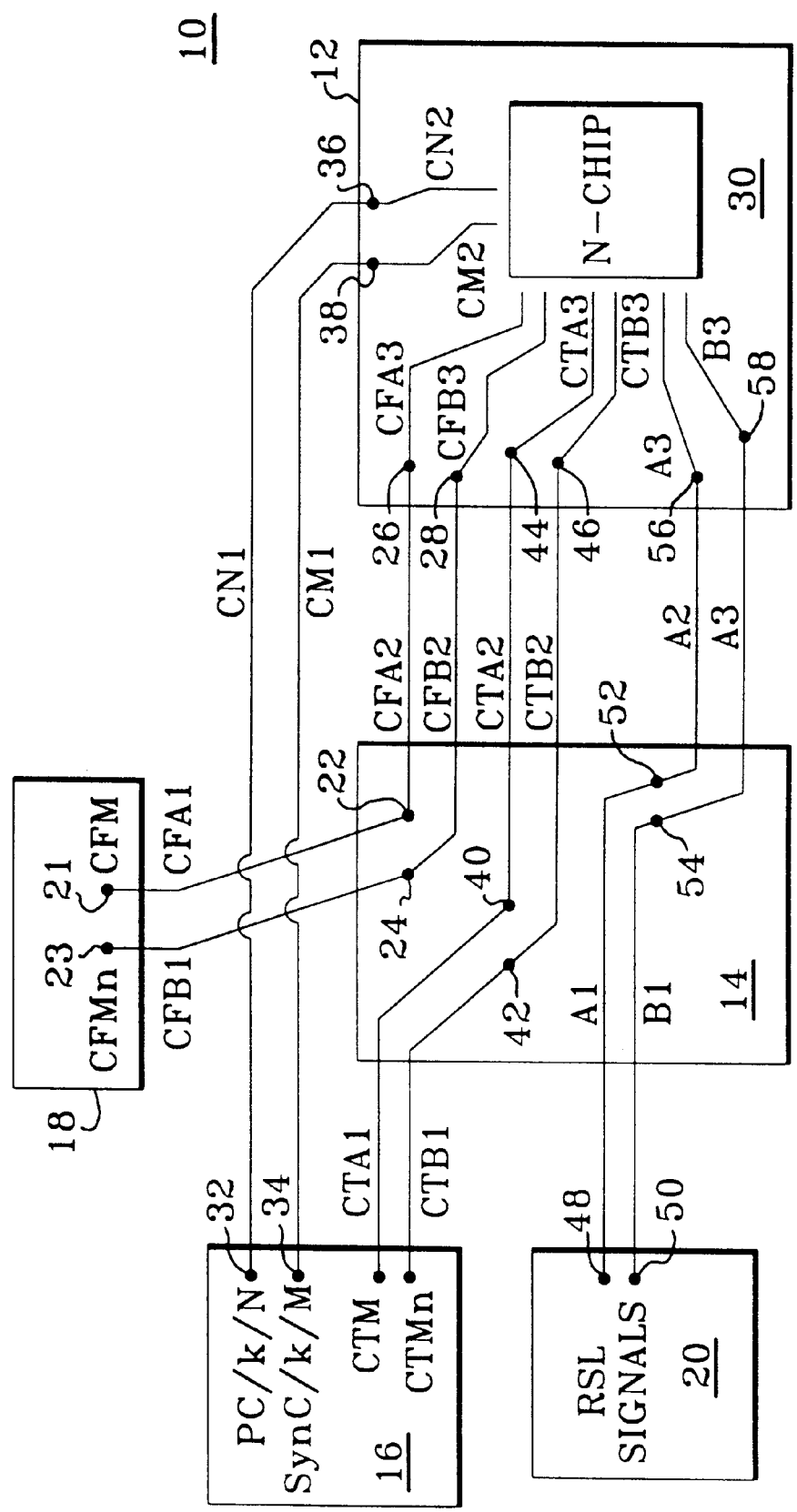
FIG. 1 is circuit diagram for illustrating a method for matching signal traces on a PCB in accordance with the present invention.

Turning to FIG. 1, a printed circuit board (PCB) 10 is indicated generally at 10 and includes a network switch chip (N-Chip) 12, a high-speed memory, an RDRAM 14 in this case, a clock generator 16 and a pair of resistive terminators 18, 20 for reducing or eliminating reflections on electrical transmission lines. The PCB 10 shown in FIG. 1 is only one example of circuit components which may be found on a typical PCB, and serves to explain the method for matching the signal trace lengths in accordance with the present invention. The PCB 10 may have a different configuration, and have more or less components provided thereon.

The terminator 18 is electrically connected to the N-Chip 12 via a pair of signal traces CFA1 and CFB1 that are connected between pins 21, 23 and pins 22, 24 on the RDRAM 14. A pair of traces CFA2 and CFB2 are connected respectively between the pins 22, 24 and pins 26, 28 on the N-Chip 12. Traces CFA3 and CFB3 formed on the substrate 30 of the N-Chip 12 and connected respectively to pins 26, 28 at one end, complete the electrical connection between the terminator 18 and the N-Chip 12.

Signals PClk/N and Synclk/M are carried between the clock generator 16 and the N-Chip 12 via a pair of trace segments CN1 and CM1, respectively, which are connected between pins 32, 34 on the clock generator and pins 36, 38 on the N-Chip. Trace segments CN2 and CM2 on the substrate 30 of the N-Chip 12 carry signals PClk/N and Synclk/M on the N-Chip. Command signals CTM and CTMn from the clock generator 16 are routed to pins 40, 42 on the RDRAM 14 by a pair of trace segments CTA1 and CTB1. Trace segments CTA2 and CTB2 are connected between the pins 40, 42 and pins 44, 46 on the N-Chip 12 to carry the signals to the N-Chip. Trace segments CTA3 and CTB3 formed on the substrate 30 of the N-Chip 12 and connected to the pins 44, 46, carry the CTM and CTMn signals within the N-Chip.

Rambus signaling level (RSL) signals are carried on a pair of trace segments A1 and B1 which are connected between pins 48, 50 on the terminator 20 and pins 52, 54 on the RDRAM 14. Trace segments A2 and B2 carry the RSL signals from the pins 52, 54 to pins 56, 58 on the N-Chip 12, and trace segments A3 and B3 formed on the substrate 30 of the N-Chip and connected to the pins 56, 58, carry the RSL signals within the N-Chip. As described above, the signal traces are divided into segments, with each segment being identified separately. In the preferred embodiment, each segment is established by a pin that is provided on the circuit component. It should be noted, however, that other means of segmenting the traces are contemplated. For example, logical nodes in the form of pins formed directly on the PCB 10 can be used to define the segments.

In matching the lengths of the traces, each segment will have its own tolerance requirements, depending on the design and/or application considerations. For example, for various design considerations or intended applications, it might be desirable to match the trace segments CFA1 and CFB1 between the terminator 18 and the RDRAM 14 within ten 1000th of an inch, or 10 mils. On the other hand, the traces between the RDRAM 14 and the N-Chip 12 including the segments CFA2, CFB2 and CFA3, CFB3 might need to be matched only within 50 mils.

Accordingly, the trace segments CFA1 and CFB1 are matched, if necessary (i.e., if not within the acceptable tolerance) separately from the rest of the trace segments between the terminator 18 and the N-Chip 12. First, the difference between the two segments CFA1 and CFB1 is determined, i.e., $$|CFA1-CFB1|<10 \text{ mils}$$

Then, the difference is added to the shorter trace to match the segment lengths exactly. If the difference between the segments CFA1 and CFB1 is within the acceptable design tolerance, then no adjustment would be necessary, unless the designer wishes to obtain an exact match.

To match the remaining trace segments between the terminator 18 and the N-Chip 12, the segment CFA2 is added to a product of the segment CFA3 and a correction factor $\beta$ for the substrate 30 of the N-Chip 12, and the segment CFB2 is added to a product of the segment CFB3 and the same correction factor $\beta$. Then, the difference of the two calculations is obtained, i.e., $$|(CFA2+(CFA3\times\beta))-(CFB2+(CFB3\times\beta))|<50\text{mils}$$

The difference is added to the shorter trace segments to exactly match the segments, or otherwise make the above mathematical expression true.

The correction factor $\beta$ compensates for the change in the signal propagation velocity from/to the PCB 10 to/from the substrate 30 of the N-Chip 12, or other similar integrated circuit (IC) components. This change is due, for example, to the dissimilar materials used for producing the PCB 10 and the substrate 30 of the N-Chip 12, resulting in variation in electrical characteristics. In the above example, the correction factor $\beta$ of only the N-Chip 12 are included in the calculation. It should be noted, however, that a correction factor of the RDRAM 14 can also be incorporated into the calculation if more precise matching is desired. In general, though, the signal traces within high-speed memory components such as the RDRAM 14 are so short as to be negligible. Also, the information necessary for calculating the correction factor for high-speed memory components are not always readily available.

The correction factor $\beta$ of the N-Chip 12 is calculated by taking the propagation delay of the substrate 30 of the N-Chip and dividing it by the propagation delay of the PCB 10, i.e., normalize the propagation delay of the PCB 10 to one (1). For example, if the propagation delay of the PCB 10 is 200 pico seconds (ps) per inch and that of the substrate 30 is 150 ps per inch, the correction factor would be as follows:

$$\beta = \frac{150 \text{ ps/inch}}{200 \text{ ps/inch}} = 0.75$$

Figure 2:
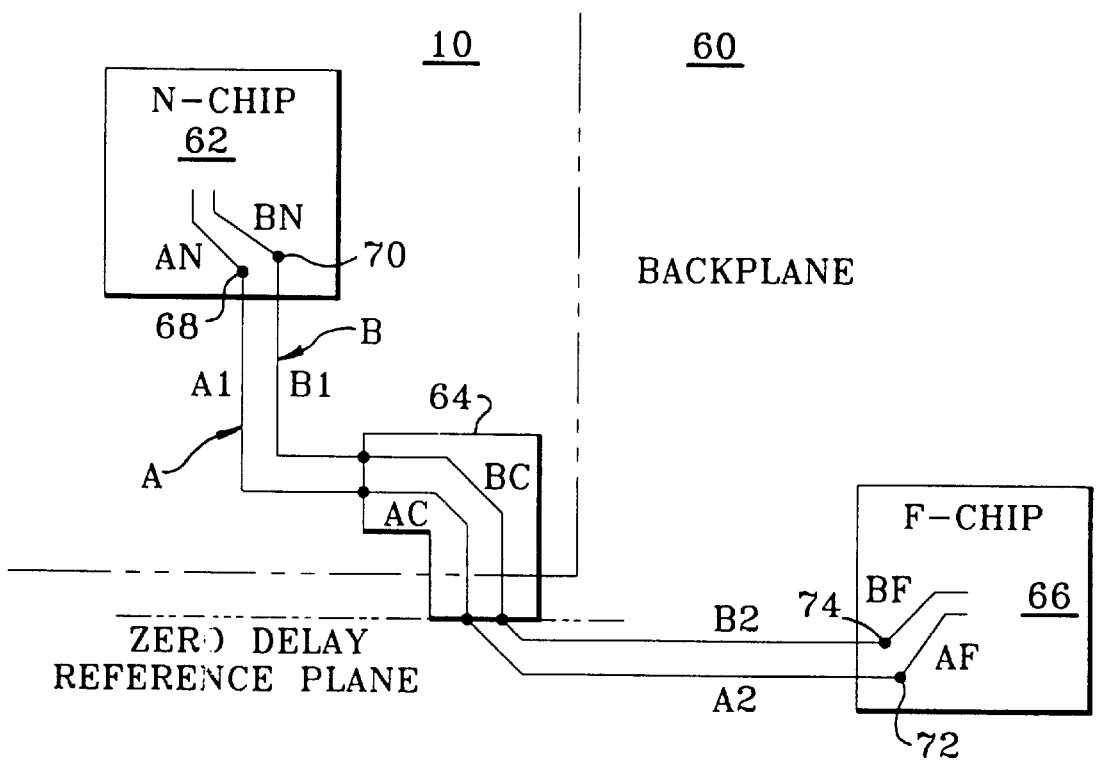
FIG. 2 is a circuit diagram for illustrating a method for matching signal traces which extend from a PCB to a backplane.

Turning now to FIG. 2, the PCB 10 is shown provided on the backplane or motherboard 60 and includes an N-Chip 62 which is electrically connected to a connector 64. The connector 64 is also electrically connected to a network fabric chip (F-Chip) 66 provided on the backplane 60. The F-Chip 66 is also connected to other N-Chips 62 or similar IC components on other PCB's (not shown), and electrically connects the PCB 10 with the backplane 60.

In FIG. 2, the connection between the N-Chip 62 and the F-Chip 66 is provided by a trace A, which is divided into trace segments AN, A1, AC, A2 and AF, and a trace B including trace segments BN, B1, BC, B2 and BF. For the two traces to match, the length of trace A must equal the length of trace B, i.e., Trace $A$=Trace $B$ $$AN+A1+AC+A2+AF=BN+B1+BC+B2+BF$$

As described above with respect to FIG. 1, the difference in the two traces A and B can be added to the shorter trace to match the total length of the two traces. Typically, ever, one or more trace segments will require a more precise matching than the others, depending on the design and the intended applications. Accordingly, the traces must be matched separately if the circuit design requires. For example, it might be desirable to match the trace segments on the PCB 10 more precisely than those on the backplane 60. Accordingly, the calculations would be as follows:

$$AN+A1+AC=BN+B1+BC$$

and $$A2+AF=B2+BF$$

If the maximum desired signal propagation velocity skew or difference for the entire length of the traces A and B is 20 pico seconds (ps), for example. Then, at 180 ps per inch propagation delay of the PCB 10 and the backplane 60, the 20 ps skew translates to a difference in the length of:

$$\frac{20 \text{ ps}}{180 \text{ ps/inch}} = .110 \text{ inch} = 110 \text{ mils.}$$

The total allowable tolerance of the difference in lengths can be then be divided as dictated by design considerations. For example, it might be desirable to have the total difference between the trace segments on the PCB 10 to be within 40 mils, which leaves 70 mils difference for the trace segments on the backplane 60. The difference in the lengths of the traces on the PCB 10 can then be calculated as follows:

$$|((AN\times\beta)+A1+AC)-((BN\times\beta)+B1+BC)|<40 \text{ mils, where } \beta=0.9$$

Typically, the difference $\Delta$ between the trace segments AC and BC in the connector 64 would be known, accordingly the above expression would be as follows:

$$|((AN\times0.9)+A1+A)-((BN\times0.9)+B1+BC)|<40 \text{ mils}$$

The difference obtained from this expression is added to the shorter of the two lengths to match the traces on the PCB 10, exactly or within the desired tolerance. The correction factor β reflects the change in the propagation delay from/to the PCB 10 to/from the substrate of the N-Chip 62, and is obtained by normalizing the propagation delay of the PCB 10, as described above.

For the trace segments in the backplane, the maximum allowable difference in the trace lengths is calculated as follows:

$$|(A2+(AF\times\beta))-(B2+(BF\times\beta))|<70 \text{ mils, where } \beta=0.9$$

or $$|(A2+(AF\times 0.9))-(B2+(BF\times 0.9))|<70 \text{ mils}$$

The difference is added to the shorter of the two lengths to obtain an exact match, or a match within the allowable tolerance. The correction factor β in the backplane 60 reflects the change in the propagation velocity from/to the backplane 60 to/from the substrate of the F-Chip 66, and is obtained by normalizing the propagation delay of the backplane, as described above. It should be noted that the propagation delay in the PCB 10 and the backplane 60 may or may not be the same, depending on the material used for these boards. If they are not the same, then it would be necessary to calculate a correction factor to compensate for the difference.

Preferably, the present method for matching the signal trace lengths are implemented in a known spreadsheet program such as Microsoft Excel or Lotus 1-2-3. It should be understood, however, that the present method can be programmed by those skilled in the art using conventional programing languages. Turning to FIGS. 3A and 3B, a spreadsheet illustrates the manner in which the traces CFA and CFB, which are connected between the terminator 18 and the N-Chip 12 as shown in FIG. 1, are matched. The trace segments CFA1 and CFB1 (shown in FIG. 3A) are matched separately from the other segments of the traces CFA and CFB because they are assumed to have a different allowable tolerance requirement in this example than the other segments.

The spreadsheet in FIG. 3A, includes a "Segment Name" column under which the trace segments to matched are listed, CFA1 and CFA2. The lengths of these segments are entered in the "Enter PCB Trace Length" column, where CFA1 is assumed to be 80 mils, and CFB1 to be 100 mils. The "Package Pin Number" column is for entering the pin number of the IC chip package, if applicable. When this field is entered, the length of the trace segment on the IC chip package is generated in the corresponding field in a "Package Trace Length" column. This is retrieved from a database that stores the corrected lengths of the trace segments within the IC chip packages, i.e., the product of the trace segment length multiplied by the correction factor β for the IC chip package.

As discussed above, the trace segments within the terminator 18 and the RDRAM 14 of FIG. 1 are being ignored in this example, because they are considered so short as to be negligible. Accordingly, the pin numbers are not entered. As a result, the "Package Trace Length" field is empty. The "Total Trace Length" column gives the total of the three previous columns, and in this case, is 80 mils for CFA1 and 100 mils for CFB1. A "Target Trace Length" column shows the longest of the traces being matched, which in this case is 100 mils. A column entitled "Within Tolerance" is provided to determine if each value in the "Total Trace Length" is within a predetermined allowable tolerance with respect to the value in the "Target Trace Length" column. The tolerance value in this example is 10 mils. As shown in the spreadsheet, the trace segment CFA1 is not within the 10 mils tolerance range. Accordingly, an "Add Trace Length for Exact Match" column provides the length that must be added to the shorter of the two trace segments, CFA1 in this case, for an exact match.

In the spreadsheet shown in FIG. 3B, the sum of the trace segments CFA2 and CFB3 are matched with the sum of the trace segments CFB2 and CFB3. The trace lengths of these segments are entered in the "Enter PCB Trace Length" column, and the pin numbers 26 and 28 of the N-Chip 12, to which these trace segments are connected, are entered in the "Package Pin Number" column. The database then automatically generates the corrected trace lengths of the segments CFA3 and CFB3 within the N-Chip 12 in the "Package Trace Length" column, i.e., the product of the actual length and the correction factor β. The sum of the value in the "Enter PCB Trace Length" column is then added to the value in the "Package Trace Length" to derive the value in the "Total Trace Length" column. The values (235 mils) in the "Target Trace Length" column is equivalent to the longer of the two lengths being matched.

The spreadsheet of FIG. 3B indicates in the "Within Tolerance" column whether the difference in the two lengths are in the acceptable tolerance range, 20 mils in this example. Since the difference is only 10 mils, they are within tolerance, and the traces do not require further matching, unless the designer desires an exact match. For this purpose, the spreadsheet in this example is provided with a column which provides the length which must be added to the shorter of the two lengths (CFA2+CFB2) to obtain an exact match.

Turning now to FIG. 4, the method for matching the traces A and B that are connected between the N-Chip 62 and the F-Chip 66 as shown in FIG. 2 is described. Matching is performed separately for the trace segments on the PCB 10 and for those on the backplane 60 since, for purposes of this example, it is assumed that the PCB 10 and the backplane 60 have separate signal propagation requirements. For the PCB 10, the lengths of the trace segments A1 and B1 are entered in a "Trace Length from Package" column, the number for the pins, to which the segments A1 and B1 are connected, are entered in the "Package Pin Number," and the identity of the trace segments in the connector 64 are entered in the "Connector" column. The database (not shown) associated with the spreadsheet stores the difference in length Δ between the connector trace segments for the connector 64, and the difference is generated in the "Connector Adjustment" column. In this example, the segment BC is longer than the segment AC by 100 mils. As such, 100 mils is added to the trace B in the "Connector Adjustment" column. The values in the "Package Trace Length" is also generated by the database associated with the spreadsheet and represents the lengths of the trace segments in the N-Chip 62, adjusted by the correction factor β.

The spreadsheet totals the values in the "Trace Length from Package," the "Package Trace Adjustment" and the "Connector Adjustment" columns to derive the values in the "Total Length" column. The longer of the two lengths then becomes the "Target Trace Length," which in this example is 2172 mils. From the total lengths of the trace segments and the target trace length, the spreadsheet determines whether the difference is within the predetermined allowable tolerance of 200 mils, for example. If it is not, a "Length for Exact Match" column provides the length (249 mils) that must be added to the shorter trace, trace A, to obtain an exact match with trace B. Of course, if an exact match is not a requirement, the designer may choose to only add a length sufficient to place the shorter length within the allowable tolerance.

With respect to the trace segments in the backplane 60 of FIG. 2, the lengths of the segments A2 and B2 (1670 mils and 1500 mils, respectively) are entered in the "Trace Length from Package" column, and the pin numbers (72, 74) of the F-Chip 66 are entered in the "Package Pin Number" column of the spreadsheet. The spreadsheet than generates the lengths of the traces (AF and BF) which are within the F-Chip 66, and displays them in the "Package Trace Length" column. The total trace segment lengths of A2 and AF, and B2 and BF are displayed in the "Total Length" column. The longer of the two length then becomes the values in the "Target Trace Length" column. The values in the "Total Trace Length" column and the "Target Trace Length" column are compared to determine whether the total length of each trace is within a predetermined acceptable tolerance. If the tolerance is set to 100 mils, for example, the sum of segments A2 and BF would not be within tolerance, since the difference would be 115 mils. Accordingly, an additional length of 115 mils would have to be added to the trace A in the backplane 60 to obtain an exact match with the segments of trace B in the backplane. Alternatively, a length anywhere from 15 mils to 114 mils can be added to the shorter trace to obtain a match which is within the predetermined acceptable tolerance.

For clarity, the present method has been described above with examples in which only two traces were matched. It should be understood, however, that any number of traces can be matched in accordance with the present invention.

From the foregoing description, it should be understood that an improved method for matching signal traces has been shown and described which has many desirable attributes and advantages. The method divides the traces into segments for more precise matching and can be implemented in a spreadsheet which provides quick and automatic calculations.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. Method for matching the lengths a plurality of signal traces which are electrically connected to at least one integrated circuit chip, each of the signal traces including a board trace which is formed on a circuit board and electrically connected to a corresponding package trace formed on the integrated circuit chip, said method comprising:

multiplying a length of each of the package traces by a correction factor for the corresponding integrated circuit chip on which the package trace is formed;

summing a length of each of the board traces and a multiplied length of each of the corresponding package traces;

subtracting each of the signal traces from a length of a longest signal trace from the plurality of signal traces after the board traces and said multiplied lengths have been summed; and, adding a difference in length obtained from said subtraction to a shorter signal trace of said subtraction.

2. The method as defined in claim 1, wherein said correction factor is obtained by dividing a signal propagation delay of the integrated circuit chip by a propagation delay of the circuit board.

3. The method as defined in claim 1, wherein said multiplication, said summation and said subtraction are performed by a spreadsheet.

4. The method as defined in claim 3, wherein a result of said multiplication is stored in a database associated with said spreadsheet.

5. Method for matching the lengths a plurality of signal traces formed on a circuit board, said method comprising:

dividing each of the signal traces into at least two electrically conductive segments;

converting a difference in signal propagation delays between the signal traces being matched within said at least one of said segments into a difference in lengths;

subtracting each of the signal traces in said at least one of said segments from a longest signal trace of the signal traces in said at least one of said segments; and, adding a difference in length obtained from said subtraction to a shorter signal trace from said subtraction, so that said difference from said subtraction is less than said difference in length obtained from said conversion, if said difference from said subtraction is greater than said difference in length obtained from said conversion.

6. The method as defined in claim 5, wherein the signal said traces are divided by at least one pin provided on at least one the circuit board.

7. The method as defined in claim 5, wherein said board traces are divided by at least one pin formed on at least one an integrated circuit chip provided on the circuit board.

8. The method as defined in claim 5, wherein said conversion is performed by dividing said predetermined signal propagation difference by a signal propagation delay of the circuit board.

9. Method for matching the lengths of a plurality of signal traces which extend from a printed circuit board to a backplane via a connector provided on the printed circuit board, said method comprising:

dividing the signal traces into a first segment and a second segment;

summing a length of each of the signal traces in said first segment with a length of a corresponding connector trace in the connector;

subtracting each of the signal traces added with said connector traces in said first segment from a longest summed signal trace in said first segment;

adding a difference in length obtained from said subtraction to a shorter signal trace from said subtraction;

subtracting each of the signal traces in said second segment from a longest signal trace in said second segment; and adding a difference in length obtained from said subtraction of said signal traces in said second segment to a shorter signal trace from said subtraction in said second segment.

10. The method as defined in claim 9 wherein said first segment is the printed circuit board and said second segment is the backplane.

11. The method as defined in claim 9 wherein said first segment is the backplane and said second segment is the printed circuit board.

12. The method as defined in claim 9 wherein when the signal traces in said first segment are connected to first package traces which are formed on at least one first integrated circuit package provided on the printed circuit board, said method further comprises, multiplying a length of each of said first package traces by a first correction factor for said corresponding first integrated circuit package on which said package traces are provided; and, adding said multiplied lengths of the said first package traces to said signal traces in said first segment to which said first package traces are connected, prior to said subtraction of the signal traces in said first segment.

13. The method as defined in claim 12 wherein when the signal traces in said second segment are connected to second package traces which are formed on at least one second integrated circuit package provided on the backplane, said method further comprises, multiplying a length of each of said second package traces by a second correction factor for said corresponding second integrated circuit pakage on which said second package traces are provided; and, adding said multiplied lengths of the said second package traces to said signal traces in said second segment prior to said subtraction of the signal traces in said second segment.

14. The method as defined in claim 13, wherein said first correction factor is obtained by dividing a signal propagation delay of said first integrated circuit package by a signal propagation delay of the printed circuit board, and said second correction factor is obtained by dividing a signal propagation delay of said second integrated circuit package by a signal propagation delay velocity of the backplane.

15. The method as defined in claim 9, wherein said summation and said subtraction in said first segment, and said subtracting in said second segment are performed by a spreadsheet.

16. The method as defined in claim 9 wherein when the signal traces in said second segment are connected to package traces which are formed on at least one integrated circuit package on the backplane, said method further comprises, multiplying a length of each of said package traces by a correction factor for the corresponding integrated circuit package on which said package traces are provided; and, adding said multiplied lengths of the said package traces to the signal traces in said second segment prior to said subtraction of the signal of the signal traces in the second segment.

17. Method for obtaining a length difference among a plurality of signal traces formed on two different surfaces, said method comprising:

dividing a propagation delay of a first surface of the two different surfaces into a propagation delay of a second surface of the two different surfaces to obtain a correction factor;

adjusting a second segment of the signal traces formed on said second surface by multiplying said second segment by said correction factor;

suninng said adjusted second segment with a first segment of the signal traces formed on said first surface to obtain a total length; and subtracting said total length of each of the signal traces from a longest total length of the signal traces.

* * * * *

UNITED STATES PATENT AND TRADEMARK OFFICE
CERTIFICATE OF CORRECTION

PATENT NO. : 6,466,008 B1 Page 1 of 1
DATED : October 15, 2002
INVENTOR(S) : Patrick Ying-Cheung Fung et al.

It is certified that error appears in the above-identified patent and that said Letters Patent is hereby corrected as shown below:

Column 9,
Line 16, delete "pakage" and insert therefor -- package --

Column 10,
Line 26, delete "suninng" and insert therefor -- summing --

Signed and Sealed this

Sixth Day of July, 2004

JON W. DUDAS
*Acting Director of the United States Patent and Trademark Office*